(12) United States Patent
Yamauchi et al.

(10) Patent No.: US 12,200,441 B2
(45) Date of Patent: Jan. 14, 2025

(54) PIEZOELECTRIC SOUND GENERATION COMPONENT

(71) Applicant: Murata Manufacturing Co., Ltd., Nagaokakyo (JP)

(72) Inventors: Masakazu Yamauchi, Nagaokakyo (JP); Sahutboon Kittayawanich, Chiang mai (TH); Pongsakorn Surintum, Lamphun (TH); Shigemasa Kusabiraki, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 233 days.

(21) Appl. No.: 17/953,421

(22) Filed: Sep. 27, 2022

(65) Prior Publication Data

US 2023/0016891 A1    Jan. 19, 2023

Related U.S. Application Data

(63) Continuation of application No. PCT/JP2021/009308, filed on Mar. 9, 2021.

(30) Foreign Application Priority Data

Jul. 9, 2020   (JP) .................................. 2020-118493

(51) Int. Cl.
  *H04R 17/00*    (2006.01)
  *H10N 30/20*    (2023.01)
  (Continued)

(52) U.S. Cl.
  CPC .............. *H04R 17/00* (2013.01); *H10N 30/20* (2023.02); *H10N 30/853* (2023.02); *H10N 30/872* (2023.02)

(58) Field of Classification Search
  CPC ...... G10K 9/122; H10N 30/20; H10N 30/853; H10N 30/872; H04R 17/00
  See application file for complete search history.

(56) References Cited

U.S. PATENT DOCUMENTS

2014/0086436 A1    3/2014   Kijima et al.

FOREIGN PATENT DOCUMENTS

JP    H01139300 U    9/1989
JP    H0241299 U     3/1990
(Continued)

OTHER PUBLICATIONS

Ikeda et al. JP H075520 Y2. Piezoelectric Buzzer. Related Publication JP H02-41299 (cited by applicant) (Year: 1995).*
(Continued)

*Primary Examiner* — Brian Ensey
(74) *Attorney, Agent, or Firm* — ArentFox Schiff LLP

(57) ABSTRACT

A piezoelectric sound generation component is provided that includes a piezoelectric vibration plate, a case with a case body and a lid that accommodates the piezoelectric vibration plate in an inner space formed by the case body and the lid, and a pin terminal provided to the lid so that the pin terminal is abutted on the piezoelectric vibration plate. The case body has a first top wall and a first circumferential wall. The lid has a second top wall, a second circumferential wall, and a protruding portion that contacts the first circumferential wall of the case body. The protruding portion has a first surface that is abutted on a contact surface, facing the first top wall, of the first circumferential wall and a second surface that couples the first surface to the second circumferential wall and is separated from the first circumferential wall.

20 Claims, 12 Drawing Sheets

(51) Int. Cl.
*H10N 30/853* (2023.01)
*H10N 30/87* (2023.01)

(56) References Cited

FOREIGN PATENT DOCUMENTS

| JP | H0255297 U | 4/1990 |
| JP | 2516993 Y2 | 11/1996 |
| JP | H0916178 A | 1/1997 |
| JP | H1152958 A | 2/1999 |
| JP | 2000333296 A | 11/2000 |
| JP | 2014066819 A | 4/2014 |

OTHER PUBLICATIONS

International Search Report in PCT/JP2021/009308, mailed May 25, 2021, 3 pages.

\* cited by examiner

PIEZOELECTRIC SOUND GENERATION COMPONENT

CROSS REFERENCE TO RELATED APPLICATIONS

This application is a continuation of PCT Application No. PCT/JP2021/009308, filed Mar. 9, 2021, which claims priority to Japanese Patent Application No. 2020-118493, filed Jul. 9, 2020, the entire contents of each of which are hereby incorporated by reference in their entirety.

TECHNICAL FIELD

The present invention relates to a piezoelectric sound generation component.

BACKGROUND

In general, piezoelectric sound generation components are currently used as an electroacoustic converter generating an alarm sound or an operation sound, in consumer and commercial electronic devices, such as household appliances and fire alarm systems, and automobiles, for example. Piezoelectric sound generation components include a piezoelectric sound generation component provided with a needle-shaped mounting terminal called pin type.

As an example, Japanese Unexamined Patent Application Publication No. 2000-333296 (hereinafter "Patent Document 1") discloses the piezoelectric buzzer that includes a piezoelectric vibration plate, a lid, and a case body that is fitted to an outer side portion of the lid and accommodates the piezoelectric vibration plate together with the lid. In such a piezoelectric buzzer, a piezoelectric vibration plate is sandwiched between a lid and a case body and thus held in an inner space formed between a top wall portion of the lid and a top wall portion of a case.

However, piezoelectric sound generation components, such as the piezoelectric buzzer disclosed in Patent Document 1, have a problem of deterioration in attachment stability between a lid and a case body which is caused by a shape of an end portion, which is to be brought into contact with the case body, in a protruding portion of the lid. Thus, an influence to vibration characteristics of the piezoelectric vibration plate is not taken into consideration.

SUMMARY OF THE INVENTION

Accordingly, it is an object of the present invention to provide a piezoelectric sound generation component that provides favorable reliability.

In an exemplary aspect, a piezoelectric sound generation component is provided that includes a piezoelectric vibration plate, a case that includes a case body having an opening and a lid closing the opening of the case body and accommodates the piezoelectric vibration plate in an inner space formed by the case body and the lid, and a pin terminal that is provided to the lid so that the pin terminal abuts on the piezoelectric vibration plate. The case body has a first top wall that is opposed to one main surface of the piezoelectric vibration plate, and a first circumferential wall that is formed on an edge portion of the first top wall. The lid has a second top wall that is opposed to the other main surface of the piezoelectric vibration plate, a second circumferential wall that is formed on an edge portion of the second top wall and has a holding surface holding the piezoelectric vibration plate, and a protruding portion that comes into contact with the first circumferential wall of the case body. The protruding portion has a first surface that is abutted on a surface of the first circumferential wall portion, the surface facing the first top wall, and a second surface that couples the first surface to the second circumferential wall and is separated from the first circumferential wall.

According to the exemplary aspects of the present invention, a piezoelectric sound generation component is provided with improved reliability.

DETAILED DESCRIPTION OF EMBODIMENTS

Figure 1:
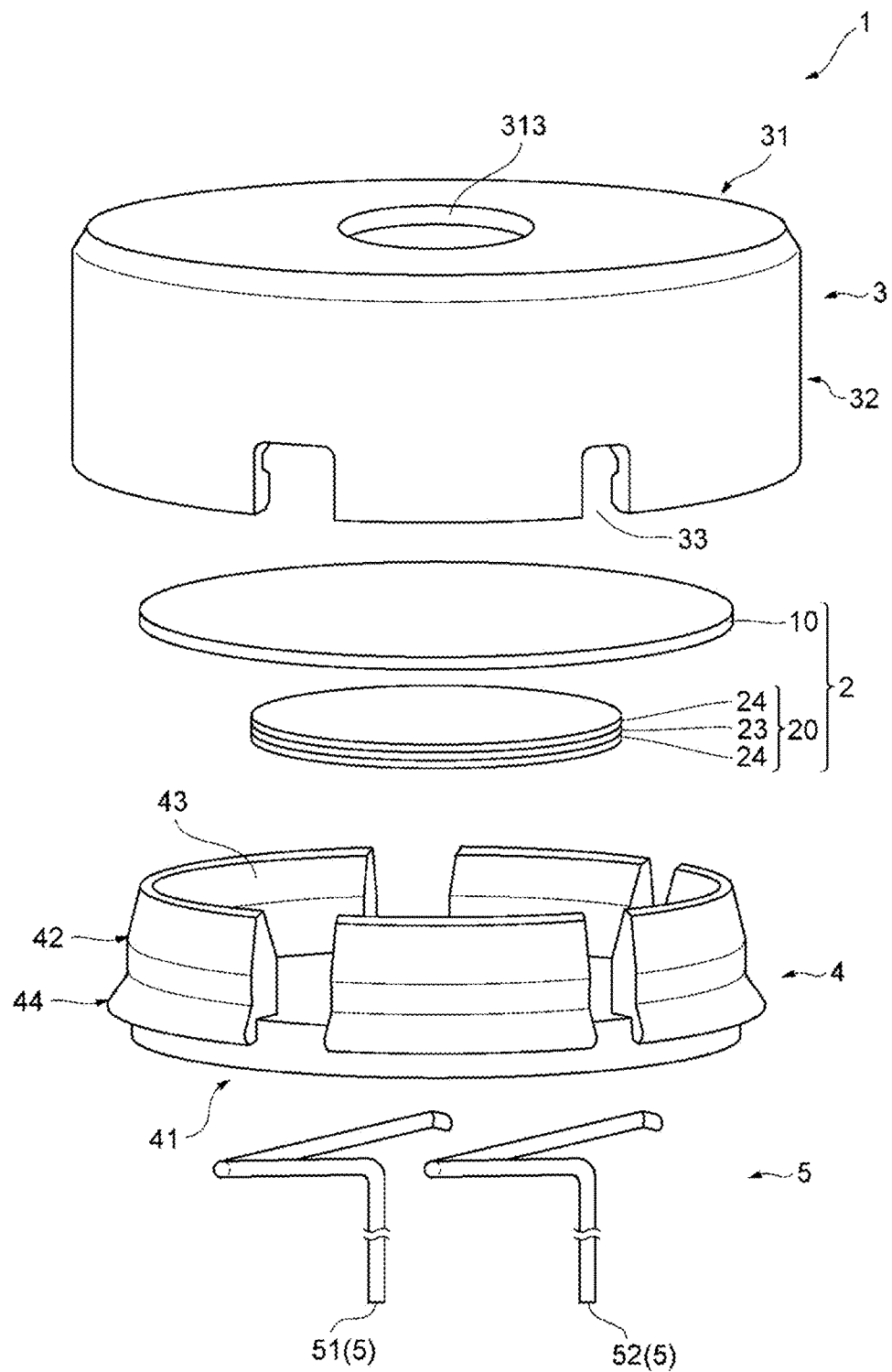
FIG. 1 is an exploded perspective view illustrating a configuration of a piezoelectric sound generation component according to a first exemplary embodiment.

Exemplary embodiments of the present invention will be described below. In the following description of drawings, the same or similar components are denoted by the same or similar reference characters. The drawings are examples, and the dimensions and shapes of respective components are schematic, and the technical scope of the invention of this application should not be limitedly interpreted to the embodiments.

First Exemplary Embodiment

<Piezoelectric Sound Generation Component 1>

Figure 2:
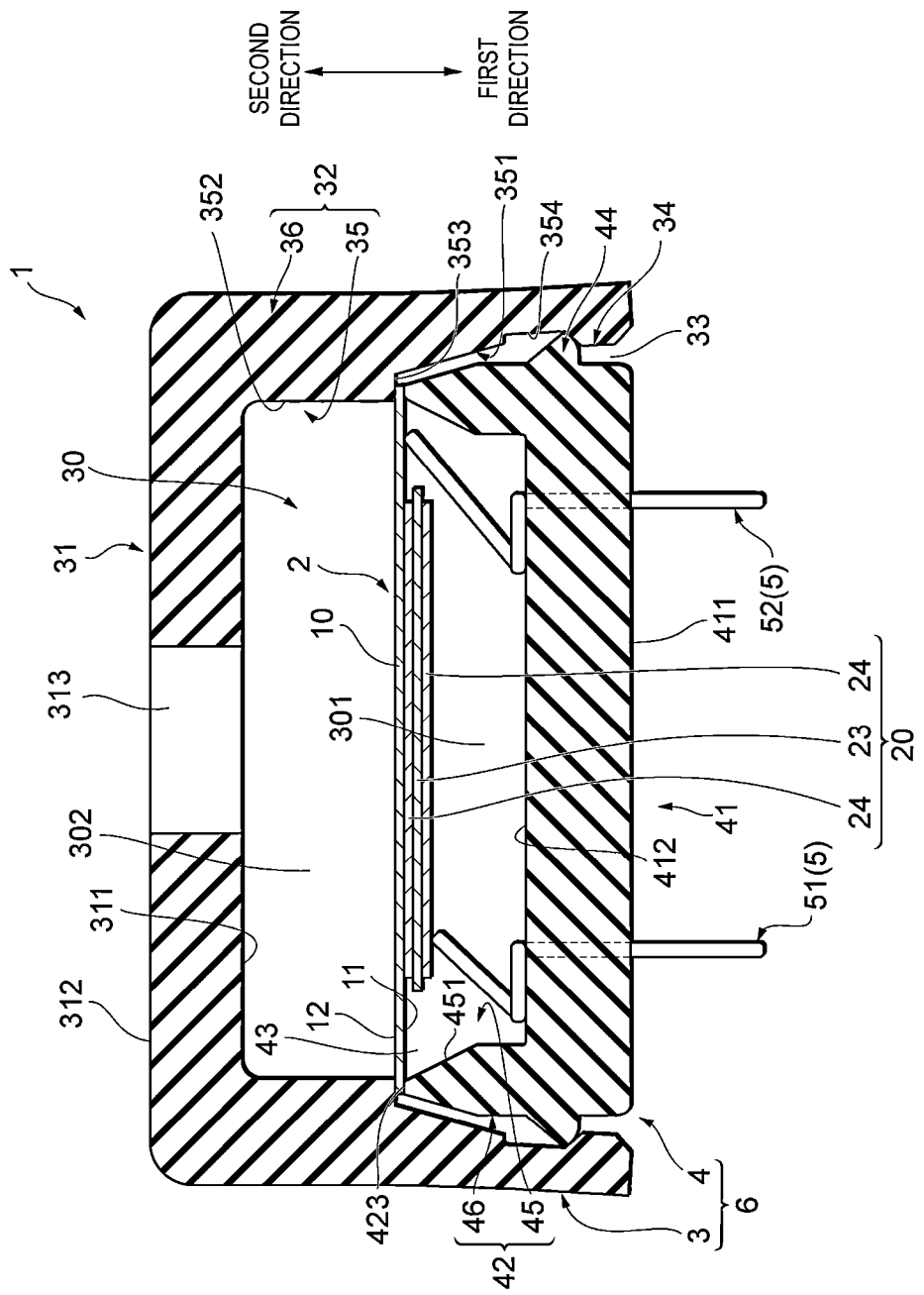
FIG. 2 is a sectional view illustrating the configuration of the piezoelectric sound generation component according to the first exemplary embodiment.

An overview of a piezoelectric sound generation component 1 according to a first exemplary embodiment will be first described with reference to FIGS. 1 and 2. FIG. 1 is an exploded perspective view for explaining a configuration of the piezoelectric sound generation component 1 according to the first embodiment. FIG. 2 is a sectional view for explaining the configuration of the piezoelectric sound generation component 1 according to the first embodiment.

The piezoelectric sound generation component 1 is an example of a pin-type sound generation component. As illustrated in FIGS. 1 and 2, the piezoelectric sound generation component 1 includes a piezoelectric vibration plate 2, a case 6, and two pieces of pin terminals 5. The case 6 accommodates the piezoelectric vibration plate 2. The pin terminals 5 are configured to apply a voltage to the piezoelectric vibration plate 2 when the pin terminals 5 are abutted on the piezoelectric vibration plate 2.

As shown in FIG. 2, the case 6 includes a case body 3 and a lid 4. The case body 3 has an opening. The lid 4 can close the opening of the case body 3 when the lid 4 is attached to the case body 3. In other words, the case body 3 and the lid 4 attached to the case body 3 form an inner space 30 of the case 6. The piezoelectric vibration plate 2 is accommodated in the inner space 30 in a manner to be sandwiched between the case body 3 and the lid 4.

Moreover, the two pieces of pin terminals 5 are provided to the lid 4. When the piezoelectric vibration plate 2 is accommodated in the inner space 30, the two pieces of pin terminals 5 are abutted on the piezoelectric vibration plate 2. Accordingly, the piezoelectric vibration plate 2 is configured to perform reciprocating vibration in the inner space 30 and generate a sound (e.g., a ringing sound) in response to an AC voltage applied from the two pieces of pin terminals 5.

Hereinafter, a state in which the piezoelectric sound generation component 1 is structured by assembling the piezoelectric vibration plate 2, the case body 3, the lid 4, and the two pieces of pin terminals 5 is sometimes referred to as an "assembled state".

<Details of Piezoelectric Sound Generation Component 1>

Figure 3:
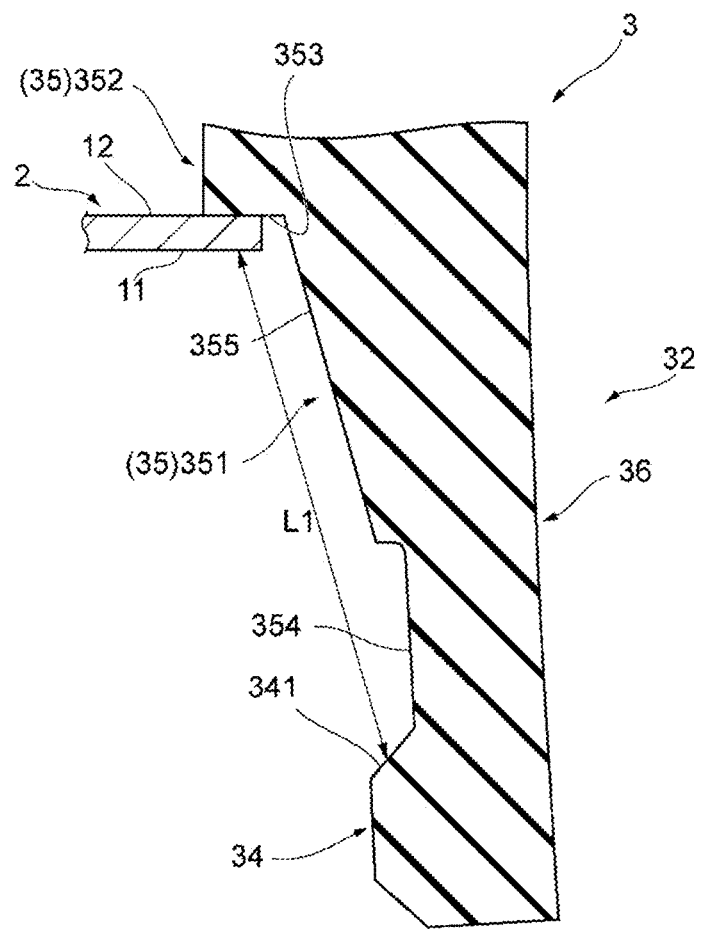
FIG. 3 is a drawing illustrating configurations of a case body and a piezoelectric vibration plate in a state before a lid according to the first exemplary embodiment is attached to the case body.
Figure 4:
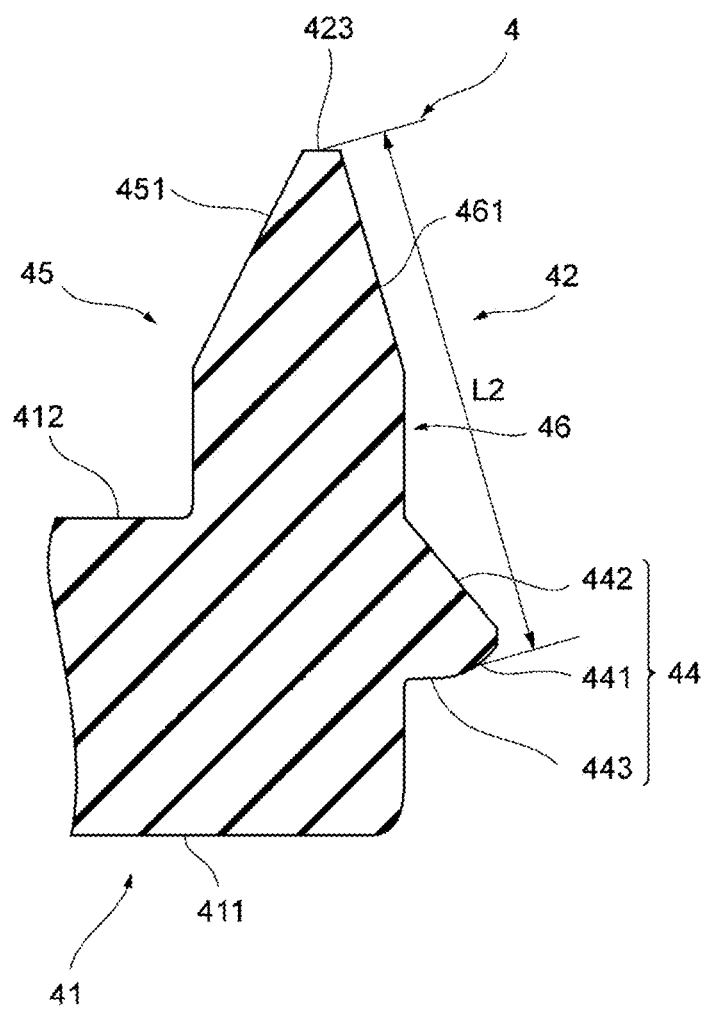
FIG. 4 is a drawing illustrating a configuration of a portion of the lid before attached to the case body according to the first exemplary embodiment.

Details of respective components of the piezoelectric sound generation component 1 will now be described with reference to FIGS. 1 to 4. FIG. 3 is a drawing illustrating configurations of the case body 3 and the piezoelectric vibration plate 2 in a state before the lid 4 according to the first embodiment is attached to the case body 3. FIG. 4 is a drawing illustrating a configuration of a portion of the lid 4 before attached to the case body 3 according to the first embodiment.

(Piezoelectric Vibration Plate 2)

As illustrated in FIGS. 1 and 2, the piezoelectric vibration plate 2 includes a substrate 10 and a vibration element 20. Both of the substrate 10 and the vibration element 20 are disc-shaped members in the exemplary aspect. The diameter of the substrate 10 is larger than the diameter of the vibration element 20. Moreover, the vibration element 20 is bonded to a central portion of one main surface (e.g., a first substrate main surface 11 described later) of the substrate 10 with an adhesive.

In an exemplary aspect, the substrate 10 is made of a material having high conductivity and spring elasticity, such as metal having an elastic modulus of 1 GPa or greater. Specifically, the substrate 10 is preferably made of 42 alloy, stainless steel (SUS), brass, phosphor bronze, or the like. Here, the substrate 10 may be made of a material other than metal, for example, may be made of a resin-based material such as a glass epoxy substrate having an elastic modulus of 1 GPa or greater or may be composed of a multilayer structure in which a plurality of materials are laminated.

Further, the substrate 10 includes the first substrate main surface 11 and a second substrate main surface 12, which are on respective sides in the thickness direction. In the assembled state, the first substrate main surface 11 faces a first direction and the second substrate main surface 12 faces a second direction opposite the first direction. Also, the first substrate main surface 11 is abutted on one (e.g., a second pin terminal 52 described later) of the two pieces of pin terminals 5.

As further shown, the vibration element 20 includes a piezoelectric plate 23 and a pair of electrodes 24. The electrodes 24 are provided on respective main surfaces of the piezoelectric plate 23 in a manner to sandwich the piezoelectric plate 23. Moreover, the piezoelectric plate 23 is a disc-shaped member. Also, the piezoelectric plate 23 is made of piezoelectric ceramics, such as PZT, in the exemplary aspect.

The pair of electrodes 24 are each a circular thin film used for applying a voltage to the piezoelectric plate 23 so as to vibrate the piezoelectric vibration plate 2 in operation. Further, the pair of electrodes 24 can be made of metal, such as Ag (baked silver), Cu, and an alloy of Cu and Ni, for example. In the assembled state, the electrode 24 positioned on the first direction side is abutted on the other one (e.g., a first pin terminal 51 described later) of the two pieces of pin terminals 5. The electrode 24 positioned in the second direction is bonded on the first substrate main surface 11 of the substrate 10 with a conductive adhesive.

(Case Body 3)

Moreover, the case body 3 is made of an insulating material, such as ceramic and resin. Also, the case body 3 has a box shape. As illustrated in FIGS. 1 and 2, the case body 3 includes a first top wall portion 31 (also referred to as a "first top wall") and a first circumferential wall portion 32 (also referred to as a "first circumferential wall") that is provided on an edge portion of the first top wall portion 31.

The first top wall portion 31 has a disc-like shape. As illustrated in FIG. 2, the first top wall portion 31 has a top wall main surface 311 and a top wall main surface 312, which are on respective sides of the first top wall portion 31 in the thickness direction. In the assembled state, the top wall main surface 311 faces the first direction and is opposed to the second substrate main surface 12 of the piezoelectric vibration plate 2. The top wall main surface 312 faces the second direction.

A sound emission hole 313 is formed on the center of the first top wall portion 31. The sound emission hole 313 penetrates through the first top wall portion 31 in the thickness direction and communicates the inside and the outside of the case body 3. Accordingly, the sound emission hole 313 is configured to emit a sound, which is generated when the piezoelectric vibration plate 2 vibrates, to the outside of the case 6 in the assembled state.

Moreover, the first circumferential wall portion 32 has a cylindrical shape. As illustrated in FIG. 2, the first circumferential wall portion 32 has an inner circumferential surface 35, an outer circumferential surface 36, and a cavity 33 that is formed on an end side farther from the first top wall portion 31.

The inner circumferential surface 35 has a first inner circumferential surface 351 positioned closer to the cavity 33, a second inner circumferential surface 352 connected with the first top wall portion 31, and a coupling surface 353 coupling the first inner circumferential surface 351 and the second inner circumferential surface 352 to each other. In the assembled state, the second inner circumferential surface 352 forms an acoustic space 302 together with the top wall main surface 311 and the piezoelectric vibration plate 2. The acoustic space 302 is on the second direction side of the inner space 30.

In the exemplary aspect, the coupling surface 353 is a stepped surface between the second inner circumferential surface 352 and the first inner circumferential surface 351 and is formed to be parallel to the first top wall portion 31. In the assembled state, the coupling surface 353 is abutted on the second substrate main surface 12 in the substrate 10 of the piezoelectric vibration plate 2. Thus, the coupling surface 353 is structurally configured to hold the piezoelectric vibration plate 2 together with a holding surface 423, described later, of the lid 4 in a manner such that the piezoelectric vibration plate 2 is sandwiched by the coupling surface 353 and the holding surface 423 from respective sides of the piezoelectric vibration plate 2 in the thickness direction.

Moreover, the first inner circumferential surface 351 has a claw portion 34, a groove portion 354, and a slanted surface 355 as illustrated in FIG. 3. The claw portion 34 is formed closer to the cavity 33. The groove portion 354 and the slanted surface 355 are formed closer to the second inner circumferential surface 352 than the claw portion 34. The claw portion 34 is formed on the entire circumference of the first inner circumferential surface 351 on the side closer to the cavity 33. Further, the claw portion 34 has a contact surface 341 that is in contact with the lid 4 in the assembled state.

The contact surface 341 is a surface, facing the first top wall portion 31 (e.g., at an angle), of the first circumferential wall portion 32. Specifically, the contact surface 341 is formed to be slanted to the first top wall portion 31 and the piezoelectric vibration plate 2 in the assembled state, as illustrated in FIG. 2.

The groove portion 354 and the slanted surface 355 are configured to function as a relief portion. The groove portion 354 and the slanted surface 355 make it possible to provide a portion other than the portion, which comes into contact with the contact surface 341, of the lid 4 in a manner to be separated from the first circumferential wall portion 32 of the case body 3, in the assembled state.

(Lid 4)

In an exemplary aspect, the lid 4 is made, for example, of the same material as that of the case body 3, that is, an insulating material such as ceramic and resin. Also, the lid 4 has a box shape. As illustrated in FIGS. 2 and 4, the lid 4 includes a second top wall portion 41 (also referred to as a "second top wall"), a second circumferential wall portion 42 (also referred to as a "first circumferential wall"), and a protruding portion 44. The second circumferential wall portion 42 is provided on an edge portion of the second top wall portion 41. The protruding portion 44 is in contact with the first circumferential wall portion 32 of the case body 3.

The second top wall portion 41 has a disc-like shape. As illustrated in FIG. 2, the second top wall portion 41 has a bottom wall main surface 411 and a bottom wall main surface 412, which are on respective sides of the second top wall portion 41 in the thickness direction. In the assembled state, the bottom wall main surface 412 faces the second direction and is opposed to the first substrate main surface 11 of the piezoelectric vibration plate 2. Moreover, the bottom wall main surface 411 faces the first direction. Further, two through holes (not illustrated) for fixing respective two pieces of pin terminals 5 are formed in the second top wall portion 41. These through holes penetrate through the second top wall portion 41 in the thickness direction and can be represented as the dashed lines in FIG. 2.

The second circumferential wall portion 42 has a cylindrical shape. As illustrated in FIG. 4, the second circumferential wall portion 42 has an inner circumferential surface 45, an outer circumferential surface 46, and a cavity 43 (see FIG. 2) that is formed on an end side farther from the second top wall portion 41. Further, the second circumferential wall portion 42 has the holding surface 423 that is formed on the end side of the second circumferential wall portion 42.

In the assembled state, the inner circumferential surface 45 forms the acoustic space 301 together with the bottom wall main surface 412 and the piezoelectric vibration plate 2. The acoustic space 301 is on the first direction side of the inner space 30. Further, a relief portion 451 and a relief portion 461 are formed on respective end sides of the inner circumferential surface 45 and outer circumferential surface 46. The relief portion 451 and the relief portion 461 make it possible to avoid interference between the two pieces of pin terminals 5 and the lid 4 and interference between the lid 4 and the first circumferential wall portion 32 of the case body 3, in the assembled state.

The holding surface 423 has a planar shape. Further, the holding surface 423 is formed to be parallel to the bottom wall main surface 412. In the assembled state, the holding surface 423 is abutted on the first substrate main surface 11 in the substrate 10 of the piezoelectric vibration plate 2. Thus, the holding surface 423 is configured to hold the piezoelectric vibration plate 2 together with the coupling surface 353 of the case body 3 in a manner such that the piezoelectric vibration plate 2 is sandwiched by the holding surface 423 and the coupling surface 353 from respective sides of the piezoelectric vibration plate 2 in the thickness direction.

The protruding portion 44 is formed on the outer circumferential side than the second top wall portion 41 and the second circumferential wall portion 42 in the main surface direction of the second top wall portion 41, as illustrated in FIG. 1. The protruding portion 44 is a portion that comes into contact with the contact surface 341 of the case body 3 in the assembled state. As illustrated in FIG. 4, the protruding portion 44 has a first surface 441, a second surface 442, and a third surface 443.

As further shown, the first surface 441 is an edge surface that is positioned on the outermost side of the protruding portion 44. Also, the first surface 441 has a curved shape. The first surface 441 may, however, have a planar shape in an alternative aspect. The first surface 441 is abutted on the contact surface 341 of the claw portion 34 formed on the first circumferential wall portion 32 of the case body 3, in the assembled state.

Moreover, the second surface 442 is a coupling surface that couples the first surface 441 and the second circumferential wall portion 42 to each other. Also, the second surface 442 is slanted toward the holding surface 423 of the second circumferential wall portion 42. The second surface 442 is separated from the first circumferential wall portion 32 of the case body 3, in the assembled state. Therefore, the second surface 442 is not pressed by the first circumferential wall portion 32 of the case body 3.

The third surface 443 is a coupling surface that couples the first surface 441 and the second top wall portion 41 to each other. Also, the third surface 443 is parallel to the holding surface 423 of the second circumferential wall portion 42. The third surface 443 is separated from the first circumferential wall portion 32 of the case body 3, in the assembled state. Therefore, the third surface 443 is not pressed by the first circumferential wall portion 32 of the case body 3.

(Pin Terminal 5)

The two pieces of pin terminals 5 are the first pin terminal 51 and the second pin terminal 52 as shown in FIGS. 51 and 52, for example. Each of the first pin terminal 51 and the second pin terminal 52 is formed by bending a lead wire whose cross-sectional shape is substantially circular. With this bended shape, the first pin terminal 51 and the second pin terminal 52 have springiness. The lead wire is made, for example, of a phosphor bronze wire rod having Sn-plated surface.

The first pin terminal 51 and the second pin terminal 52 are fixed on the lid 4 through two respective through holes that are formed in the second top wall portion 41 of the lid 4. Each of the first pin terminal 51 and the second pin terminal 52 is abutted on the piezoelectric vibration plate 2 and is electrically connected with the piezoelectric vibration plate 2 in the assembled state.

Specifically, the first pin terminal 51 is electrically connected with the electrode 24, which is positioned on the first direction side, of the piezoelectric vibration plate 2, as illustrated in FIG. 2. The second pin terminal 52 is electrically connected with the electrode 24, which is positioned on the second direction side, of the piezoelectric vibration plate 2 through connection with the substrate 10 of the piezoelectric vibration plate 2. That is, the Thus, the first pin terminal 51 and the second pin terminal 52 can apply an AC voltage to the pair of electrodes 24, respectively, of the piezoelectric vibration plate 2.

<Attachment Between Lid 4 and Case Body 3>

Figure 5:
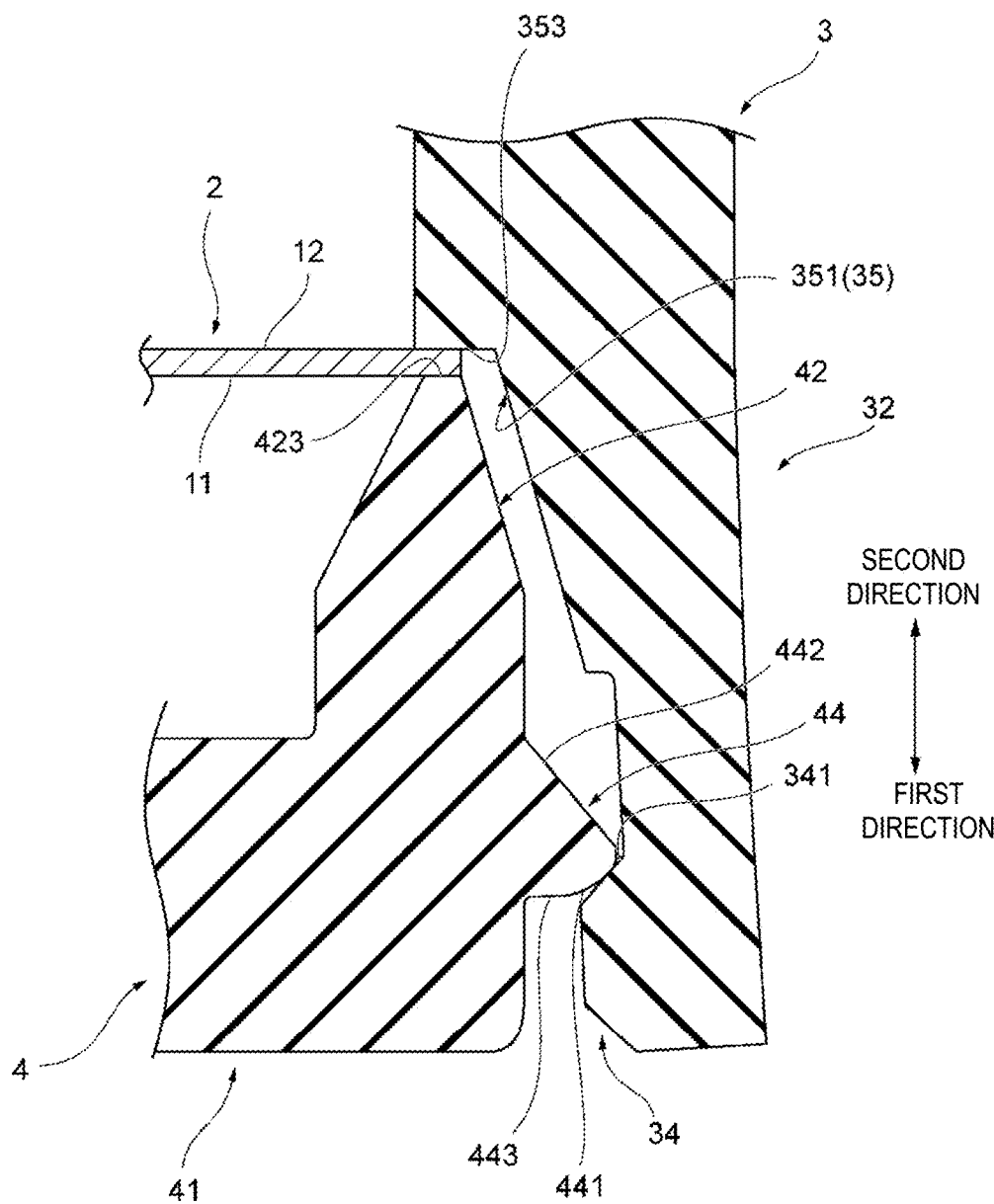
FIG. 5 is an enlarged sectional view illustrating an attachment state between the lid according to the first exemplary embodiment and the case body.

Attachment between the lid 4 and the case body 3 will now be described with reference to FIGS. 3 to 5. FIG. 5 is an enlarged sectional view illustrating an attachment state between the lid 4 according to the first embodiment and the case body 3.

As illustrated in FIG. 5, the lid 4 is attached and fixed to the case body 3 in the assembled state. In this state, the case body 3 and the lid 4 sandwich the piezoelectric vibration plate 2, holding the piezoelectric vibration plate 2 in the inner space 30. Thus, the attachment between the lid 4 and the case body 3 includes fixing between the lid 4 and the case body 3 and holding of the piezoelectric vibration plate 2 by the lid 4 and case body 3, which are fixed.

In the attachment process between the lid 4 and the case body 3, the piezoelectric vibration plate 2 is first placed on the coupling surface 353 of the case body 3 in a manner such that the second substrate main surface 12 of the substrate 10 of the piezoelectric vibration plate 2 is brought into contact with the coupling surface 353 of the case body 3. Then, the lid 4 is inserted toward the inside of the case body 3 through the cavity 33 of the case body 3 in a manner such that the holding surface 423 of the second circumferential wall portion 42 of the lid 4 is brought into contact with the first substrate main surface 11 of the substrate 10 of the piezoelectric vibration plate 2 which is placed on the coupling surface 353.

Here, when the piezoelectric vibration plate 2 is placed on the coupling surface 353 of the case body 3 before the lid 4 is inserted into the case body 3, a linear distance from the first substrate main surface 11 of the piezoelectric vibration plate 2 to the contact surface 341 of the case body 3 is L1, as illustrated in FIG. 3. In the lid 4 before inserted into the case body 3, a linear distance from the holding surface 423 of the lid 4 to the first surface 441 of the protruding portion 44 is L2, as illustrated in FIG. 4. Here, the distance L2 is longer than the distance L1. Therefore, when the lid 4 is inserted in the inside of the case body 3 and is abutted on the piezoelectric vibration plate 2, the second circumferential wall portion 42 and the protruding portion 44 of the lid 4 are fitted between the first substrate main surface 11 of the piezoelectric vibration plate 2 placed on the coupling surface 353 and the contact surface 341 of the case body 3, as illustrated in FIG. 5.

In this fitted state, the first surface 441 of the protruding portion 44 of the lid 4 receives pressure directing to a direction having a second direction component from the contact surface 341, abutted on the first surface 441, of the claw portion 34. The holding surface 423 of the second circumferential wall portion 42 of the lid 4 receives pressure directing to the first direction from the piezoelectric vibration plate 2, which is abutted on the holding surface 423 and placed on the coupling surface 353. In other words, the lid 4 is pressed on the piezoelectric vibration plate 2 placed on the coupling surface 353 by the pressure from the contact surface 341 of the claw portion 34. At the same time, the lid 4 is pressed on the contact surface 341 of the claw portion 34 by a reaction force of the pressure from the contact surface 341, from the piezoelectric vibration plate 2 placed on the coupling surface 353.

Thus, the second circumferential wall portion 42 and the protruding portion 44 of the lid 4 are constrained by the coupling surface 353 and the contact surface 341 of the case body 3. As a result, the lid 4 is attached and fixed to the case body 3 and the piezoelectric vibration plate 2 is sandwiched and held by the lid 4 and the case body 3 at the same time. Also, a portion in the first surface 441 of the protruding portion 44 of the lid 4 is deformed from the curved shape to a planar shape by the received pressure, in the fitted state.

<Advantageous Effect in Employing Lid 4>

Figure 6:
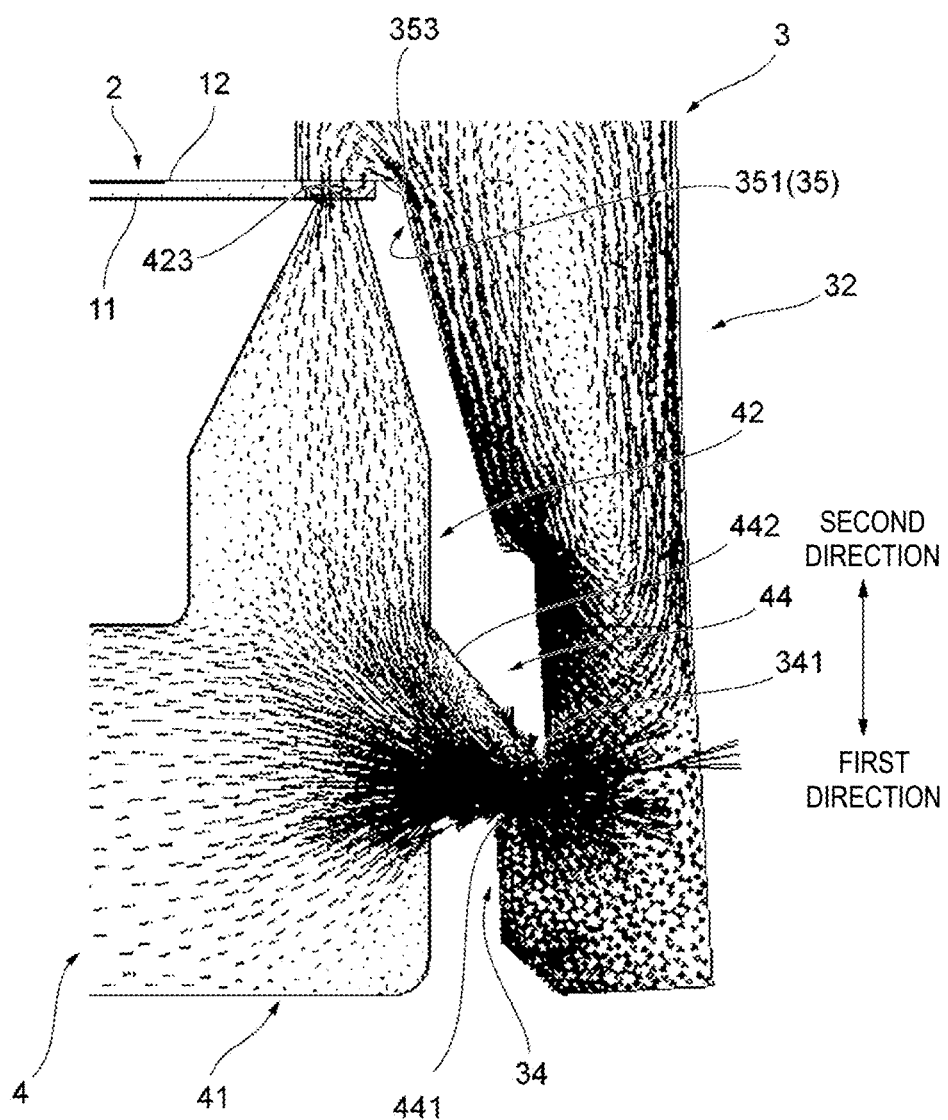
FIG. 6 is a stress distribution diagram of FIG. 5.
Figure 11:
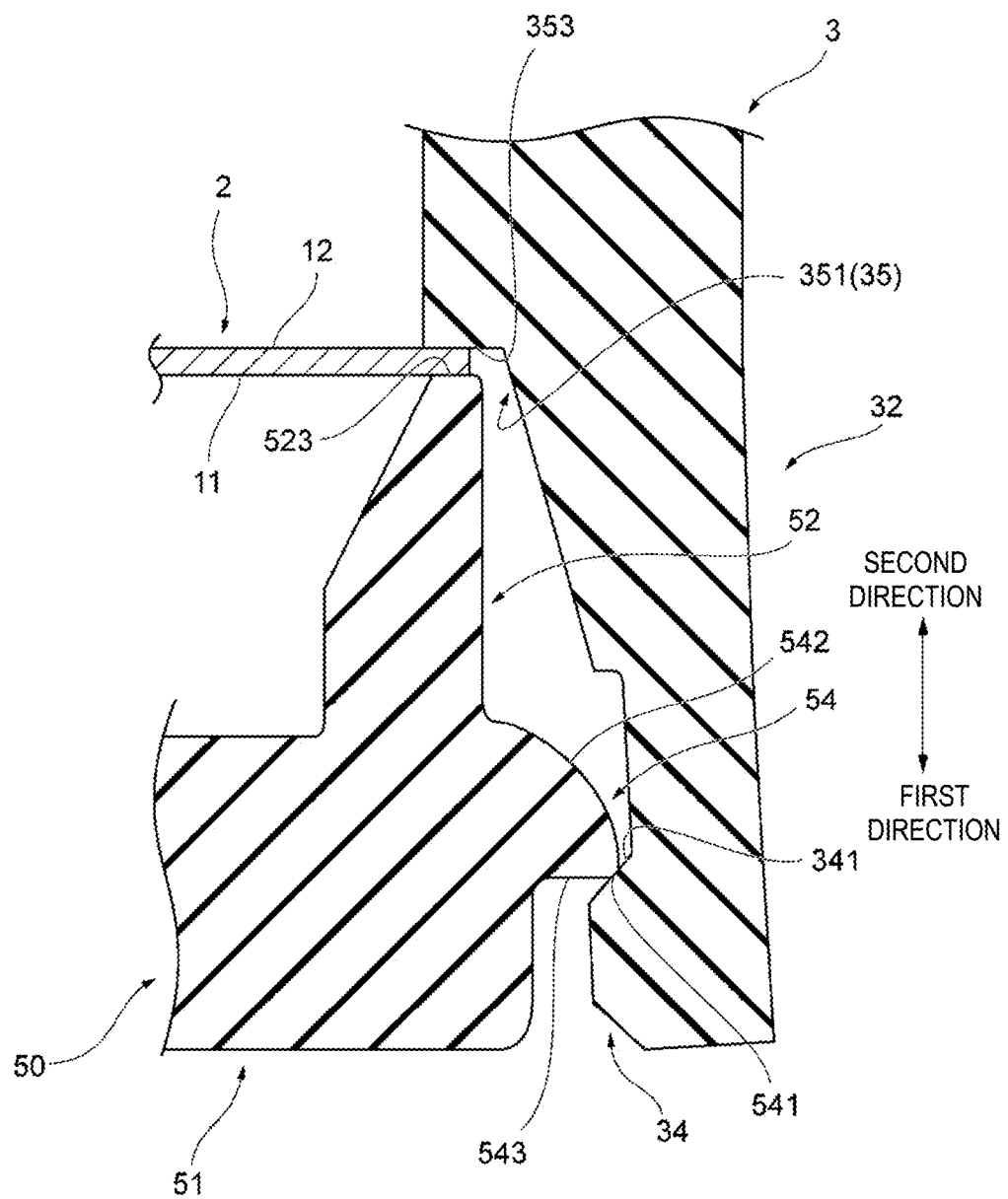
FIG. 11 is an enlarged sectional view illustrating an attachment state between a lid according to a comparative example and a case body.
Figure 12:
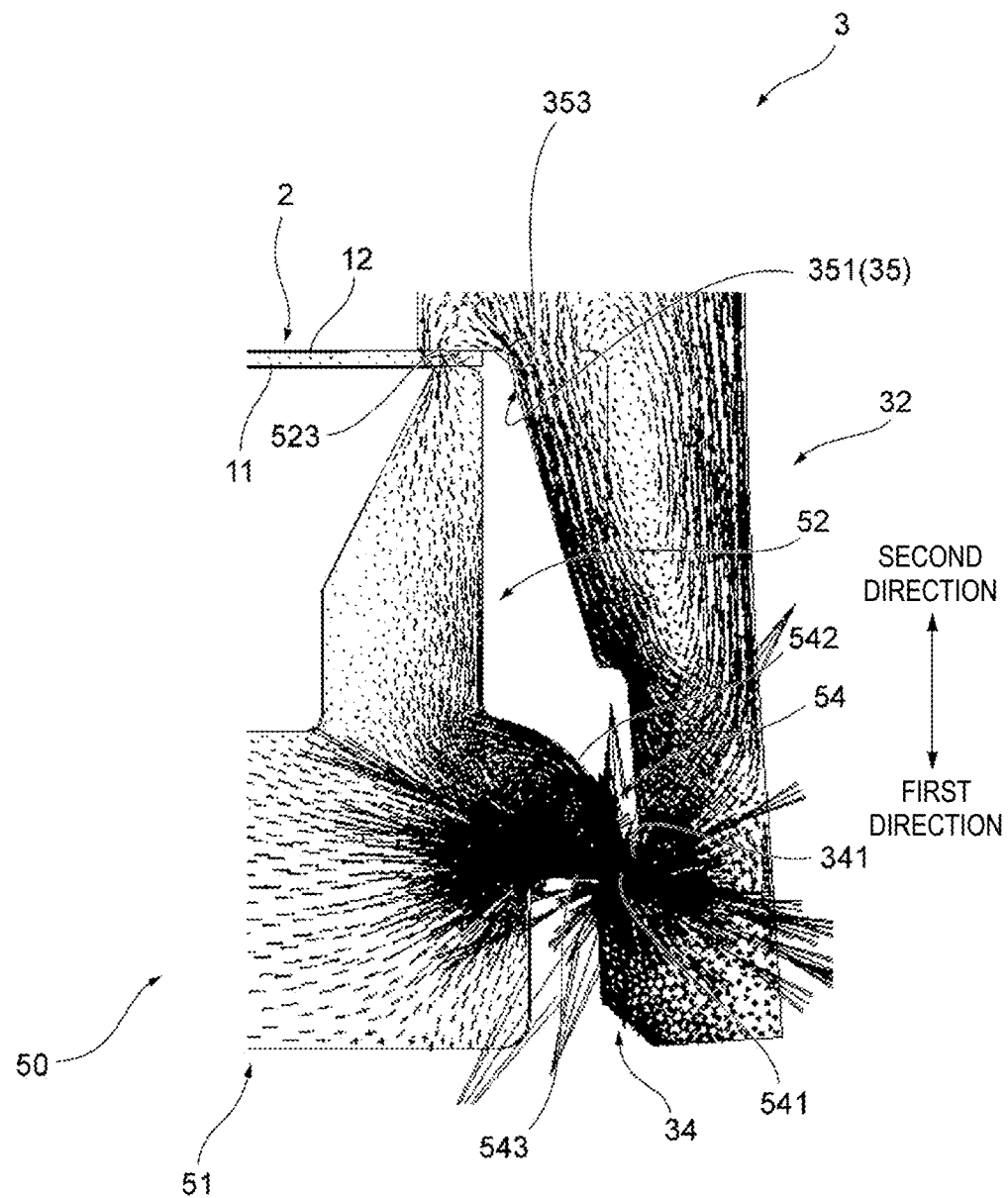
FIG. 12 is a stress distribution diagram of FIG. 11.

Advantageous effects in employing the lid 4 according to the first exemplary embodiment will now be described by explaining stress distribution in a configuration in which the lid 4 according to the first embodiment is attached to the case body 3 while comparing to stress distribution in a configuration in which a lid 50 according to a comparative example is attached to the case body 3, with reference to FIGS. 5, 6, 11, and 12. FIG. 6 is a stress distribution diagram of FIG. 5. FIG. 11 is an enlarged sectional view illustrating an attachment state between the lid 50 according to the comparative example and the case body 3. FIG. 12 is a stress distribution diagram of FIG. 11.

Comparative Example

The difference between a piezoelectric sound generation component according to the comparative example and the piezoelectric sound generation component 1 according to the first exemplary embodiment is a protruding portion 54 of the lid 50 in the piezoelectric sound generation component according to the comparative example. As illustrated in FIG. 11, the protruding portion 54 according to the comparative example has an edge 541, a second surface 542, and a third surface 543. The edge 541 of the protruding portion 54 is a portion that comes into contact with the case body 3 in the assembled state. On the other hand, different from the first surface 441 of the protruding portion 44 according to the first embodiment, the edge 541 according to the comparative example is a crossing line between the second surface 542 and the third surface 543. That is, the edge 541 according to the comparative example does not have a plane shape but has a linear shape.

Thus, the contact between the edge 541 according to the comparative example and the contact surface 341 of the case body 3 is line contact, in the assembled state. In a case where there is variation in the shape of the contact surface 341 of the claw portion 34 of the case body 3, a portion of the edge 541 may be prevented from coming into contact with the contact surface 341 of the case body 3. In such a case, contact between the edge 541 according to the comparative example and the contact surface 341 of the case body 3 is sometimes point contact. A contact area between the edge 541 according to the comparative example and the contact surface 341 of the case body 3 is accordingly small, in the assembled state. A dimension of an end portion, coming into contact with the contact surface 341, on the end side of the protruding portion 54 according to the comparative example, that is, a dimension of an end portion at which the second surface 542 and the third surface 543, which intersect with each other, are sandwiched is small due to the shape of the edge 541.

Accordingly, the pressure from the contact surface 341 of the case body 3 generates larger stress on the edge 541 according to the comparative example in the assembled state, as illustrated in FIG. 12. Further, the dimension of the end portion of the edge 541 is small, disabling the pressure received by the edge 541 from sufficiently diffusing in the inside of the end portion of the protruding portion 54. The stress thus concentrates on the end portion of the protruding portion 54 according to the comparative example, as illustrated in FIG. 12. Such large internal stress makes the configuration of the protruding portion 54 of the lid 50 according to the comparative example unstable and may cause breakdown of the configuration. An occurrence of such breakdown of the protruding portion 54 disables the protruding portion 54 from securely coming into contact with the contact surface 341 of the case body 3. Accordingly, the lid 50 cannot securely hold the piezoelectric vibration plate 2. The fixing state of the piezoelectric vibration plate 2 is thus unstable and this sometimes increases the variation in the vibration characteristics of the piezoelectric vibration plate 2. Consequently, reliability of the piezoelectric sound generation component may be degraded.

First Exemplary Embodiment

On the other hand, the lid 4 according to the first embodiment employs the protruding portion 44 having the first surface 441, solving the above-described problem of the comparative example. The first surface 441 according to the first embodiment has the curved shape. Therefore, even though there is variation in the shape of the contact surface 341 of the claw portion 34 of the case body 3, the protruding portion 44 of the lid 4 utilizes the curved shape of the first surface 441 so that it is configured to adjust a contact part between the first surface 441 and the contact surface 341. The first surface 441 and the contact surface 341 can thus securely come into contact with each other, being able to prevent an occurrence of point contact of the two. Further, a portion in the first surface 441 of the protruding portion 44 is deformed to a planar shape by the pressure from the contact surface 341 of the case body 3, in the assembled state. Accordingly, at least a portion of the contact between the first surface 441 of the protruding portion 44 of the lid 4 and the contact surface 341 of the case body 3 is surface contact in the assembled state. Thus, a contact area between the first surface 441 of the lid 4 according to the first embodiment and the contact surface 341 of the case body 3 is larger than the linear or point contact between the edge 541 of the lid 50 according to the comparative example and the contact surface 341 of the case body 3. As a result, stress generated on the first surface 441 of the protruding portion 44 of the lid 4 is smaller in the case employing the lid 4 according to the first embodiment than the case employing the lid 50 according to the comparative example, as illustrated in FIG. 6.

Further, the first surface 441 has a certain area different from the edge 541 according to the comparative example, as illustrated in FIG. 5. Accordingly, the dimension of the end portion, sandwiched by the second surface 442 and the third surface 443 which are provided on respective sides of the first surface 441, of the protruding portion 44 is larger than the dimension of the end portion, sandwiched by the second surface 542 and the third surface 543, of the protruding portion 54 according to the comparative example. Therefore, the pressure received by the first surface 441 can sufficiently diffuse in the inside of the end portion of the protruding portion 44 compared to the comparative example. In this configuration, stress concentration does not occur at the end portion of the protruding portion 44 according to the first embodiment, as illustrated in FIG. 6. Accordingly, the protruding portion 44 of the lid 4 according to the first embodiment does not break down due to excessive internal stress. The protruding portion 44 of the lid 4 according to the first embodiment is thus configured to maintain stability of the contact with the contact surface 341 of the case body 3. Accordingly, the lid 4 can securely hold the piezoelectric vibration plate 2. The fixing state of the piezoelectric vibration plate 2 is thus stable and consequently, the variation in the vibration characteristics of the piezoelectric vibration plate 2 can be reduced and the reliability of the piezoelectric sound generation component can be enhanced.

Further, part of the pressure from the contact surface 341 of the case body 3 can be transmitted toward the holding surface 423 of the second circumferential wall portion 42 of the lid 4 by the guide of the second surface 442 of the protruding portion 44. As a result, a force, acting on the piezoelectric vibration plate 2, of the holding surface 423 of the second circumferential wall portion 42 of the lid 4 is larger than the comparative example. Accordingly, the lid 4 can more stably and securely hold the piezoelectric vibration plate 2. As a result, the variation in the vibration characteristics of the piezoelectric vibration plate 2 can be further reduced and the reliability of the piezoelectric sound generation component can be enhanced.

Thus, in the first embodiment, the piezoelectric sound generation component that provides favorable reliability is provided by employing the protruding portion 44 having the above-described characteristics.

Second Exemplary Embodiment

Figure 7:
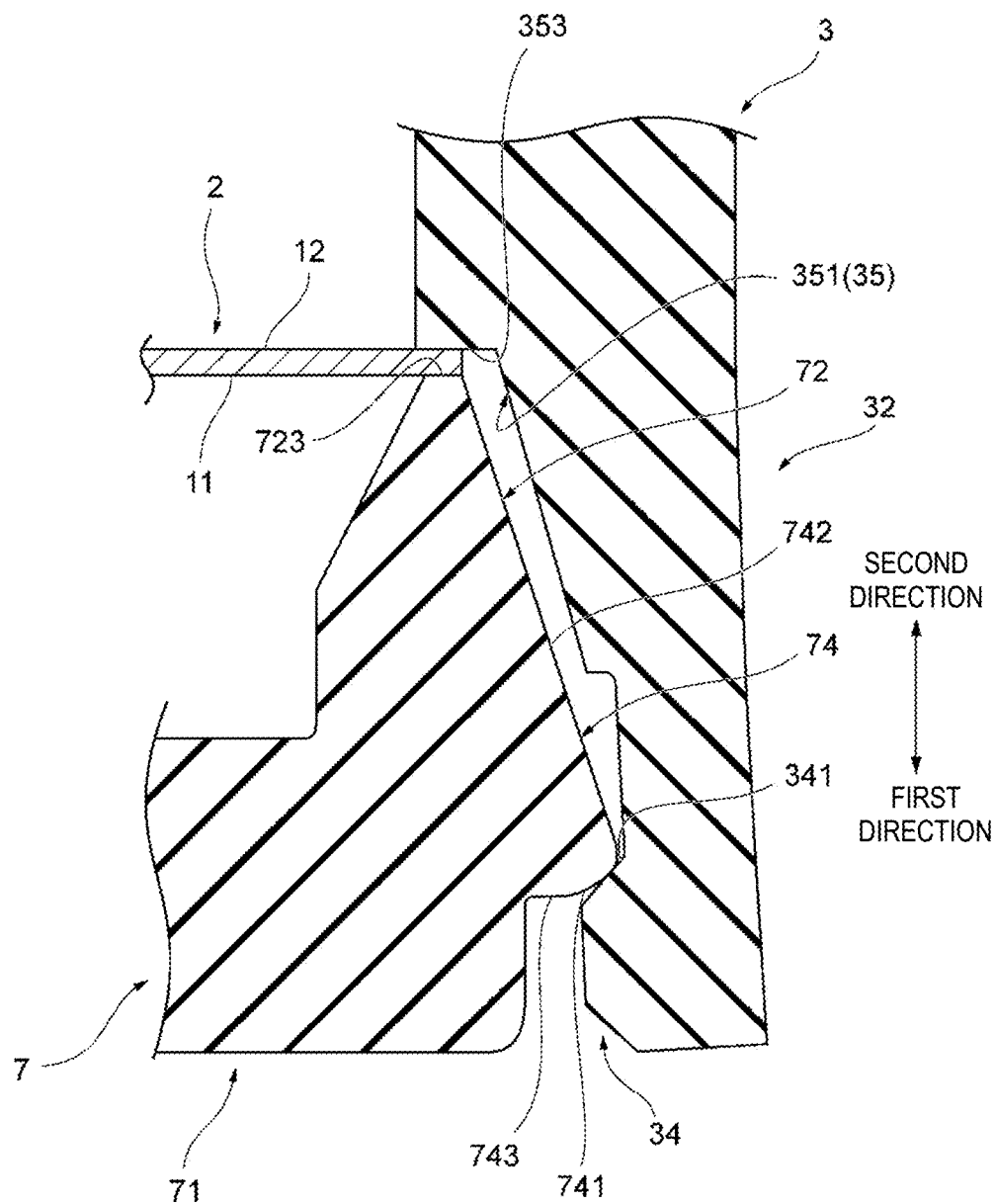
FIG. 7 is an enlarged sectional view illustrating an attachment state between a lid according to a second exemplary embodiment and a case body.
Figure 8:
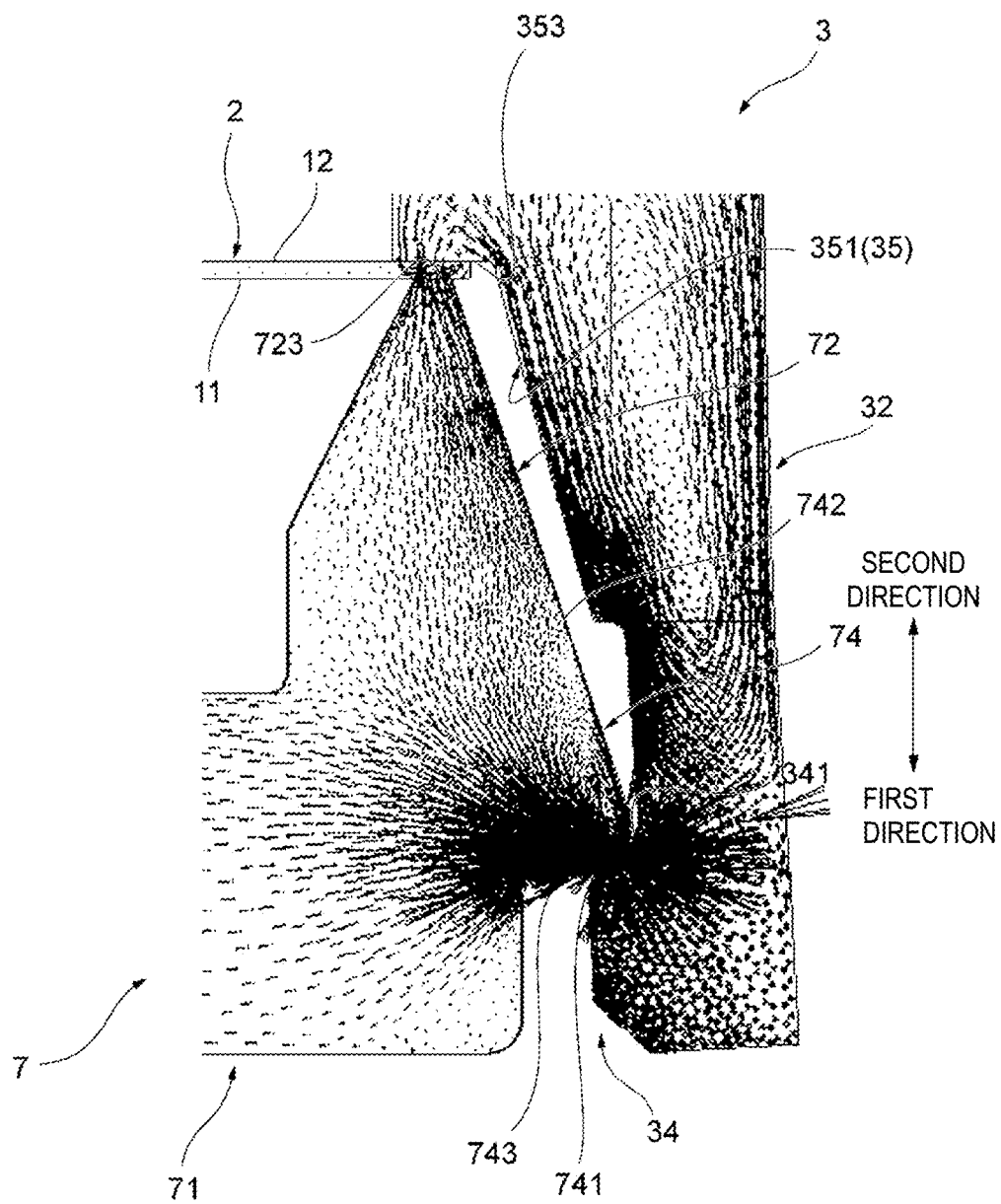
FIG. 8 is a stress distribution diagram of FIG. 7.

Attachment between a lid 7 according to a second embodiment and the case body 3 will now be described with reference to FIGS. 7 and 8. FIG. 7 is an enlarged sectional view illustrating an attachment state between the lid 7 according to the second embodiment and the case body 3. FIG. 8 is a stress distribution diagram of FIG. 7.

The following description about the second embodiment will omit the description of matters common to those of the first embodiment described above, but the different point, that is, a configuration of a protruding portion 74 of the lid 7 will be described. In particular, the same advantageous effects obtained from the same configuration will not be mentioned.

Different from the configuration of the second surface 442 of the protruding portion 44 of the lid 4 according to the first embodiment, a second surface 742 of the protruding portion 74 of the lid 7 according to the second embodiment is formed to couple a first surface 741 of the protruding portion 74 and a holding surface 723 of a second circumferential wall portion 72 to each other, as illustrated in FIG. 7. The protruding portion 74 according to the second embodiment is thus larger than the protruding portion 44 according to the first embodiment. The second surface 742 forms an outer circumferential surface of the second circumferential wall portion 72. Also, an angle formed by the second surface 742 and the holding surface 723 is an obtuse angle.

Accordingly, the employment of the lid 7 having the above-described protruding portion 74 provides a configuration to guide pressure, received by the first surface 741 of the protruding portion 74, from the contact surface 341 of the case body 3 to be directly transmitted to the holding surface 723, as illustrated in FIG. 8, in the second exemplary embodiment. A holding force applied to the piezoelectric vibration plate 2 by the holding surface 723 of the lid 7 is thus larger and accordingly, the lid 7 can securely hold the piezoelectric vibration plate 2. Further, the second surface 742 of the protruding portion 74 forms the outer circumferential surface of the second circumferential wall portion 72. The dimensions of the protruding portion 74 and an end portion of the protruding portion 74 according to the second embodiment are thus larger than those of the protruding portion 44 and the end portion of the protruding portion 44 according to the first embodiment. Therefore, the strength of the protruding portion 74 according to the second embodiment is enhanced. At the same time, the pressure received by the first surface 741 of the protruding portion 74 can sufficiently diffuse in the inside of the end portion of the protruding portion 74. As a result, an occurrence of the stress concentration can be more securely reduced at the end portion of the protruding portion 74 according to the second embodiment.

Third Exemplary Embodiment

Figure 9:
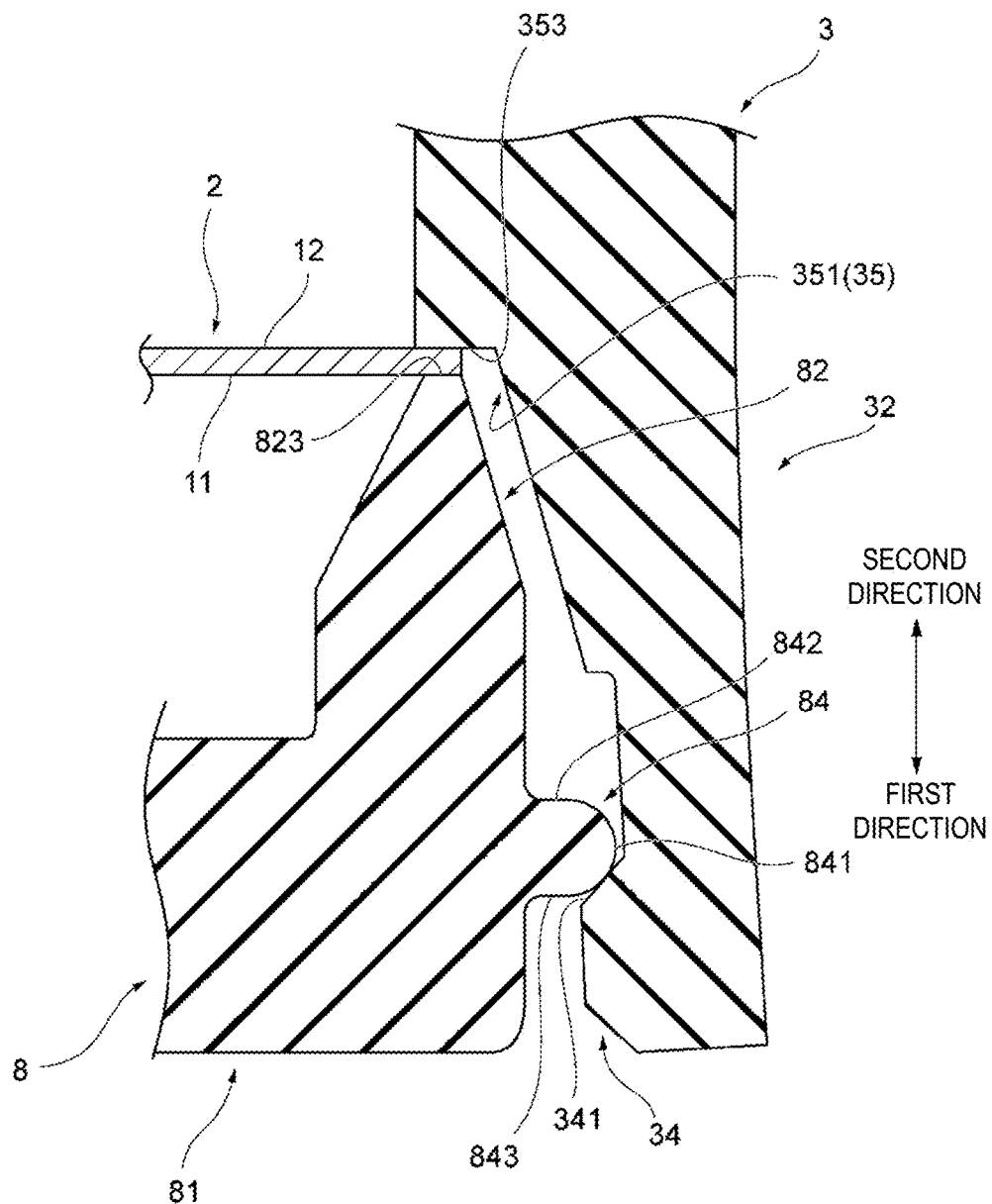
FIG. 9 is an enlarged sectional view illustrating an attachment state between a lid according to a third exemplary embodiment and a case body.
Figure 10:
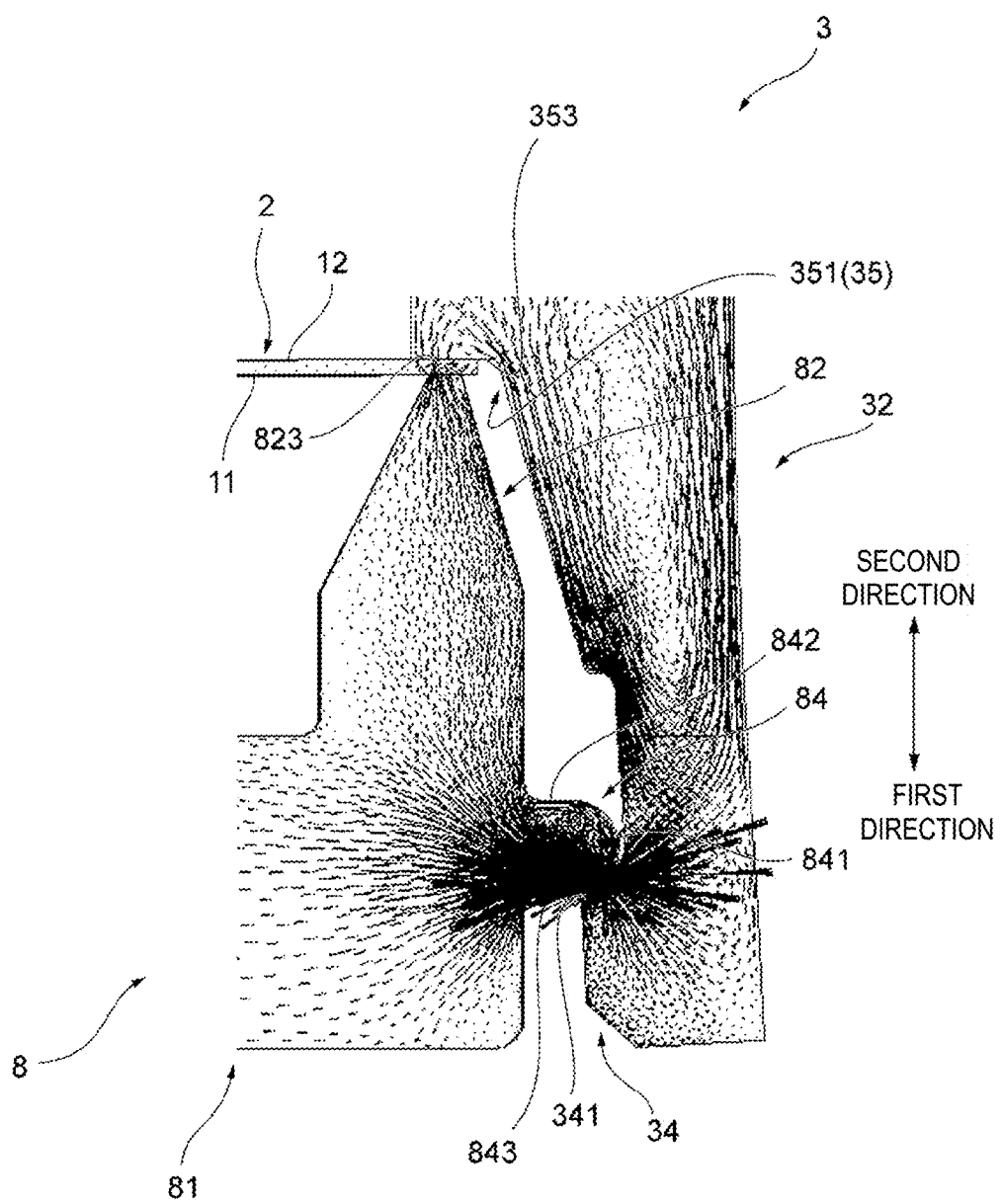
FIG. 10 is a stress distribution diagram of FIG. 9.

Attachment between a lid 8 according to a third embodiment and the case body 3 will now be described with reference to FIGS. 9 and 10. FIG. 9 is an enlarged sectional view illustrating an attachment state between the lid 8 according to the third embodiment and the case body 3. FIG. 10 is a stress distribution diagram of FIG. 9.

The following description about the third embodiment will omit the description of matters common to those of the first embodiment described above, but the different point, that is, a configuration of a protruding portion 84 of the lid 8 will be described. In particular, the same advantageous effects obtained from the same configuration will not be mentioned.

Different from the configuration of the second surface 442 of the protruding portion 44 of the lid 4 according to the first embodiment, a second surface 842 of the protruding portion 84 of the lid 8 according to the third embodiment is formed to be parallel to a holding surface 823 of a second circumferential wall portion 82 of the lid 8, as illustrated in FIG. 9. The protruding portion 84 according to the third embodiment is thus smaller than the protruding portion 44 according to the first embodiment. On the other hand, a first surface 841 of the protruding portion 84 according to the third embodiment is larger than the first surface 441 of the protruding portion 44 according to the first embodiment.

Thus, the employment of the lid 8 having the above-described protruding portion 84 enlarges a range in which the first surface 841 of the protruding portion 84 and the contact surface 341 of the case body 3 can come into contact with each other, as illustrated in FIG. 10, in the third embodiment. This configuration enlarges a range in the lid 8 in which variation in the contact surface 341 of the case body 3 can be adjusted. Further, the protruding portion 84 according to the third embodiment is smaller than the protruding portion 44 according to the first embodiment. This reduces a relief space that is required to be formed in the case body 3 so as to avoid interference between the case body 3 and the protruding portion 84 of the lid 8, in the assembled state. As a result, the strength of the case body 3 can be enhanced and design flexibility of the case body 3 can be improved.

The exemplary embodiments of the present invention have been described thus far.

The piezoelectric sound generation component 1 according to an exemplary embodiment of the present invention includes the piezoelectric vibration plate 2, the case 6 that includes the case body 3 having an opening and the lid 4 closing the opening of the case body 3 and accommodates the piezoelectric vibration plate 2 in the inner space 30 formed by the case body 3 and the lid 4, and the pin terminal 5 that is provided to the lid 4 so that the pin terminal 5 is abutted on the piezoelectric vibration plate 2. The case body 3 has the first top wall portion 31 that is opposed to one main surface of the piezoelectric vibration plate 2, and the first circumferential wall portion 32 that is formed on an edge portion of the first top wall portion 31. The lid 4 has the second top wall portion 41 that is opposed to the other main surface of the piezoelectric vibration plate 2, the second circumferential wall portion 42 that is formed on an edge portion of the second top wall portion 41 and has the holding surface 423 holding the piezoelectric vibration plate 2, and the protruding portion 44 that contacts the first circumferential wall portion 32 of the case body 3. The protruding portion 44 has the first surface 441 that is configured to abut the contact surface 341, which is a surface facing the first top wall portion 31, of the first circumferential wall portion 32, and the second surface 442 that couples the first surface 441 and the second circumferential wall portion 42 to each other and is separated from the first circumferential wall portion 32.

According to the above-mentioned configuration, stability of attachment between the lid and the case body is improved, reducing the variation in the vibration characteristics of the piezoelectric vibration plate. Thus, the piezoelectric sound generation component is provided with favorable or improved reliability.

Moreover, it is noted that first surface 441 of the protruding portion 44 can have a curved shape or a planar shape in exemplary embodiments.

According to the above-mentioned configuration, an area of a contact surface of the protruding portion is enlarged, which can improve the stability of the attachment.

Also, in the above-mentioned configuration, the second surface 442 of the protruding portion 44 can be parallel to the holding surface 423.

According to the above-mentioned configuration, the protruding portion is formed in a smaller shape, which can improve the design flexibility of the whole of the piezoelectric sound generation component.

Also, in the above-mentioned configuration, the second surface 442 of the protruding portion 44 may be slanted toward the holding surface 423.

According to the above-mentioned configuration, a force generated in the inside of the protruding portion can be transmitted to the holding surface, which can improve the stability of the attachment.

Also, in the above-mentioned configuration, the second surface 442 of the protruding portion 44 can couple the first surface 441 of the protruding portion 44 to the holding surface 423 of the second circumferential wall portion 42, and an angle formed by the second surface 442 and the holding surface 423 can be an obtuse angle.

According to the above-mentioned configuration, a force generated in the inside of the protruding portion can be directly transmitted to the holding surface, which can improve the stability of the attachment and increase the strength of the protruding portion.

In the above-mentioned configuration, the contact surface 341, which is a surface facing the first top wall portion 31, of the first circumferential wall portion 32 can be slanted to the main surface of the piezoelectric vibration plate 2, and the first surface 441 of the protruding portion 44 can be an edge surface that is positioned on the end side of the protruding portion 44.

According to the above-mentioned configuration, the fixing state of the piezoelectric vibration plate is stabilized, which reduces the variation in the vibration characteristics of the piezoelectric vibration plate and enhances the reliability of the piezoelectric sound generation component.

It is noted that each of the embodiments is described above for facilitating the understanding of the present invention, and is not described for limiting the interpretation of the present invention. The present invention can be modified/improved without departing from the spirit thereof, and the present invention also includes an equivalent thereof. That is, each embodiment whose design is appropriately changed by those skilled in the art is also included in the scope of the present invention as long as the embodiment has the features of the present invention. For example, elements included in each embodiment and those arrangement, materials, conditions, shapes, sizes, and the like are not limited to those exemplified, and can be appropriately changed. Further, each of the embodiments is exemplary and it goes without saying that partial substitution or combination of the configurations described in different embodiments can be performed, and this is also included in the scope of the present invention as long as the features of the present invention are included.

REFERENCE SIGNS LIST 1 piezoelectric sound generation component
2 piezoelectric vibration plate
3 case body
4 lid
5 pin terminal
6 case
10 substrate
20 vibration element
23 piezoelectric plate
24 electrode
30 inner space
31 first top wall portion
32 first circumferential wall portion
34 claw portion
41 second top wall portion
42 second circumferential wall portion
44 protruding portion
341 contact surface
441 first surface
442 second surface

The invention claimed is:

1. A piezoelectric sound generation component comprising:
a piezoelectric vibration plate;
a case that includes a case body having an opening and a lid coupled to the case body to accommodate the piezoelectric vibration plate in an inner space formed by the case body and the lid; and
a pin terminal that is provided to the lid, such that the pin terminal abuts the piezoelectric vibration plate,
wherein the case body has a first top wall that is opposed to a first main surface of the piezoelectric vibration plate, and a first circumferential wall disposed on an edge portion of the first top wall,
wherein the lid has a second top wall that is opposed to a second main surface of the piezoelectric vibration plate opposite the first main surface, a second circumferential wall disposed on an edge portion of the second top wall and that has a holding surface that holds the piezoelectric vibration plate, and a protruding portion that contacts the first circumferential wall of the case body, and
wherein the protruding portion has a first surface that is configured to be abutted on a surface of the first circumferential wall that faces the first top wall, and a second surface that couples the first surface to the second circumferential wall and is separated from the first circumferential wall.

2. The piezoelectric sound generation component according to claim 1, wherein the first surface of the protruding portion has a curved shape.

3. The piezoelectric sound generation component according to claim 1, wherein the first surface of the protruding portion has a planar shape.

4. The piezoelectric sound generation component according to claim 1, wherein the second surface of the protruding portion is parallel to the holding surface of the second circumferential wall.

5. The piezoelectric sound generation component according to claim 1, wherein the second surface of the protruding portion is slanted toward the holding surface of the second circumferential wall.

6. The piezoelectric sound generation component according to claim 5, wherein:
the second surface of the protruding portion couples the first surface of the protruding portion to the holding surface of the second circumferential wall, and
an angle formed by the second surface and the holding surface is an obtuse angle.

7. The piezoelectric sound generation component according to claim 1, wherein the surface of the first circumferential wall that faces the first top wall is slanted to two main surfaces of the piezoelectric vibration plate.

8. The piezoelectric sound generation component according to claim 7, wherein the first surface of the protruding portion is an edge surface that is positioned on an end side of the protruding portion.

9. The piezoelectric sound generation component according to claim 1, wherein the piezoelectric vibration plate includes a substrate and a vibration element that are each disc-shaped members with a diameter of the substrate being larger than a diameter of the vibration element.

10. The piezoelectric sound generation component according to claim 9, wherein the pin terminal is directly coupled to one of the substrate and the vibration element.

11. The piezoelectric sound generation component according to claim 1, wherein the first circumferential wall has an inner circumferential surface that includes a first inner circumferential surface positioned closer to a cavity defined by the first circumferential wall, a second inner circumferential surface connected with the first top wall, and a coupling surface that couples the first inner circumferential surface to the second inner circumferential surface.

12. The piezoelectric sound generation component according to claim 11, wherein the coupling surface is a stepped surface between the second inner circumferential surface and the first inner circumferential surface and is parallel to the first top wall.

13. The piezoelectric sound generation component according to claim 11, wherein the first inner circumferential surface has a claw portion, a groove portion, and a slanted surface.

14. The piezoelectric sound generation component according to claim 13, wherein the claw portion is disposed formed on an entire circumference of the first inner circumferential surface on a side closer to the cavity.

15. The piezoelectric sound generation component according to claim 11, wherein the holding surface is configured to hold the piezoelectric vibration plate together with the coupling surface such that the piezoelectric vibration plate is sandwiched by the holding surface and the coupling surface from respective sides of the piezoelectric vibration plate in a thickness direction of the piezoelectric sound generation component.

16. A piezoelectric sound generation component comprising:
   a piezoelectric vibration plate;
   a case body coupled to a lid coupled to define an inner space that accommodates the piezoelectric vibration plate therein; and
   wherein the case body has a first top wall that opposes the piezoelectric vibration plate and a first circumferential wall disposed on an edge of the first top wall,
   wherein the lid has a second top wall that opposes the piezoelectric vibration plate, a second circumferential wall disposed on an edge of the second top wall and that has a holding surface that holds the piezoelectric vibration plate, and a protruding portion that contacts the first circumferential wall of the case body,
   wherein the protruding portion has a first surface that is curved and that abuts a surface of the first circumferential wall that faces the first top wall, and
   wherein the first inner circumferential surface has a claw portion, a groove portion, and a slanted surface.

17. The piezoelectric sound generation component according to claim 16, wherein the protruding portion has a second surface that couples the first surface to the second circumferential wall and that is separated from the first circumferential wall.

18. The piezoelectric sound generation component according to claim 16, further comprising a pin terminal that is provided to the lid to abut the piezoelectric vibration plate.

19. The piezoelectric sound generation component according to claim 17, wherein the second surface of the protruding portion is parallel to the holding surface of the second circumferential wall.

20. The piezoelectric sound generation component according to claim 17,
   wherein the second surface of the protruding portion is slanted toward the holding surface of the second circumferential wall,
   wherein the second surface of the protruding portion couples the first surface of the protruding portion to the holding surface of the second circumferential wall, and
   wherein an angle formed by the second surface and the holding surface is an obtuse angle.

* * * * *